United States Patent [19]

Tousignant

[11] Patent Number: 5,046,552
[45] Date of Patent: Sep. 10, 1991

[54] FLOW-THROUGH HEAT TRANSFER APPARATUS WITH MOVABLE THERMAL VIA

[75] Inventor: Lew A. Tousignant, St. Paul, Minn.

[73] Assignee: Minnesota Mining and Manufacturing, St. Paul, Minn.

[21] Appl. No.: 556,021

[22] Filed: Jul. 20, 1990

[51] Int. Cl.⁵ .................. F24D 19/02; F28F 5/00; H01L 25/04
[52] U.S. Cl. .................. 165/46; 165/80.4; 361/385; 357/82
[58] Field of Search .................. 165/46, 80.4, 908; 361/382, 385, 389; 357/82

[56] References Cited

U.S. PATENT DOCUMENTS

| | | | |
|---|---|---|---|
| 4,067,042 | 1/1978 | Novak et al. | 165/80.4 |
| 4,138,692 | 2/1979 | Meeker et al. | 165/80.4 |
| 4,155,402 | 5/1979 | Just | 165/46 |
| 4,381,032 | 4/1983 | Cutchaw | 165/46 |
| 4,551,787 | 11/1985 | Mittal et al. | 165/185 |
| 4,777,561 | 10/1988 | Murphy et al. | 165/80.4 |
| 4,791,983 | 12/1988 | Nicol et al. | 165/80.4 |
| 4,920,574 | 4/1990 | Yamamoto et al. | 165/80.4 |

FOREIGN PATENT DOCUMENTS

| | | | |
|---|---|---|---|
| 0151068 | 8/1985 | European Pat. Off. | 361/385 |
| 0130450 | 7/1984 | Japan | 357/82 |
| 0039856 | 3/1985 | Japan | 357/82 |
| 0018159 | 1/1986 | Japan | 357/82 |
| 0221655 | 9/1988 | Japan | 357/82 |
| 0197709 | 9/1977 | U.S.S.R. | 361/382 |

OTHER PUBLICATIONS

IBM Technical Disclosure Bulletin, vol. 29, No. 3, (Aug. 1985).
Reprint from *Electronic Products* magazine, Jan., 1989.

*Primary Examiner*—John Ford
*Attorney, Agent, or Firm*—Gary L. Griswold; Walter N. Kirn; James D. Christoff

[57] ABSTRACT

A heat transfer apparatus especially useful for cooling electronic components has a frame with a channel for the flow of heat transfer liquid, a flexible sheet connected to the frame, and a thermal via coupled to the sheet. As fluid flows through the channel, the sheet and via move outwardly for contact with the component to be cooled. A cover structure extends across the frame adjacent the via and limits outward movement of the sheet. The cover structure also prevents damage to the sheet when the apparatus is handled.

6 Claims, 2 Drawing Sheets

FLOW-THROUGH HEAT TRANSFER APPARATUS WITH MOVABLE THERMAL VIA

BACKGROUND OF THE INVENTION

1. Field Of The Invention

This invention relates to heat transfer apparatus especially useful for cooling electronic components.

2. Description Of The Related Art

Cooling of electric devices including electronic components such as integrated circuits is often accomplished by the use of fans, passive heat sinks, or both. Fans provide forced-air convection cooling, but may produce an unacceptable level of noise. Passive heat sinks dissipate thermal energy from components by conduction, but require a certain volume which may be difficult to provide within compact or densely arranged electronic systems.

A recent development that has been found to efficiently transfer heat in compact electronic systems is the thermal transfer bag, also known as the Liquid Heat Sink bag available from Minnesota Mining and Manufacturing Company, assignee of the present invention. The bag is made of a flexible sheet of material, and has an inner, closed compartment that is filled with a thermally conductive, chemically inert, essentially gas free body of liquid which comprises fluorochemical liquid. The bag is placed between a heat-generating component and a heat-dissipating surface of a heat sink, and thermal conduction through the liquid as well as some convective currents of liquid within the closed chamber of the bag transfer heat from the component to the heat sink.

The aforementioned thermal transfer bag is advantageous in that the flexible material geometrically conforms to the shape of the cavity between the component and the heat sink within the electronic equipment, and readily establishes intimate contact with the heat-generating component and the heat-dissipating surface to establish a thermal path therebetween. In some applications, the inherent shock-absorbing nature of the filled bag functions as a packing or cushion to protect the component from physical shock damage. The bag can easily be removed and replaced in the field during repair of the equipment, and may optionally be provided with an adhesive to retain the bag in a particular location.

However, it is sometimes difficult to provide sufficient space for passive heat sinks with such thermal transfer bags in certain electronic equipment having components that produce relatively large amounts of heat, particularly where a number of heat-producing components are spaced closely together. In such circumstances, an active, flow-through liquid cooling system may be considered, so that the flowing fluid may be used to transfer heat to a heat sink (such as a chilled water supply, refrigeration system or liquid-to-air heat exchanger) remote from the heat source.

One type of flow-through cooling apparatus for integrated circuits is described in IBM Technical Disclosure Bulletin, Vol. 28, No. 3 (August 1985). The aforementioned reference describes a coolant compartment with a flexible wall, and a metal plate attached to the wall contacts a multi-chip module and includes a number of studs that extend through the wall and into the coolant to act as fins. While this type of apparatus has certain advantages over passive heat transfer devices, there is a continuing need to improve the efficiency of heat transfer of active heat transfer apparatus for electrical devices, and also provide apparatus that is sufficiently rugged to withstand repeated handling and yet is adaptable for use in a variety of electronic devices.

SUMMARY OF THE INVENTION

The present invention concerns heat transfer apparatus that comprises a frame having a channel for the flow of heat transfer fluid, and the channel has an inlet and an outlet. A sheet of flexible material is connected to the frame, and a portion of the sheet extends along the channel, is movable and has a hole. A thermal via extends through the hole and has a first portion and a second portion, and the via is connected to the sheet for movement therewith. The first portion extends outwardly from the sheet and the channel for thermal connection with a heat generating component, and the second portion is located in the channel for contact with the heat transfer fluid. The apparatus further includes structure connected to the frame and extending across at least a portion of the sheet adjacent the via for limiting outward movement of the sheet when heat transfer fluid is directed through the channel.

In use, the pressure of the heat transfer fluid flowing through the channel deflects the flexible material and the via therewith in a direction away from the channel, and the via firmly contacts the heat generating component. Since outward movement of the sheet adjacent the via is limited by the structure, the orientation of the via when the sheet is deflected is generally more predictable than would otherwise be possible. As such, there is an increased likelihood of intimate contact and hence good thermal coupling between the via and the electronic component, which is particularly important when a number of via are provided on the same sheet for contact with different, respective electronic components. In addition, the structure serves to protect the flexible film from damage when the apparatus is handled as may be encountered, for example, when the electrical equipment is repaired.

DETAILED DESCRIPTION OF THE PREFERRED EMBODIMENT

Figure 1:
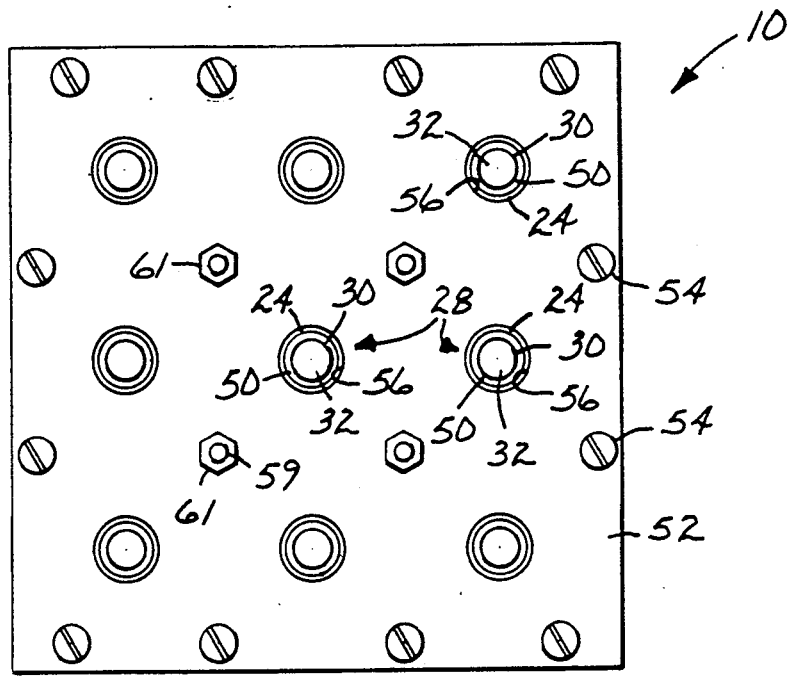
FIG. 1 is a plan view of a flow-through heat transfer apparatus constructed in accordance with the present invention.
Figure 2:
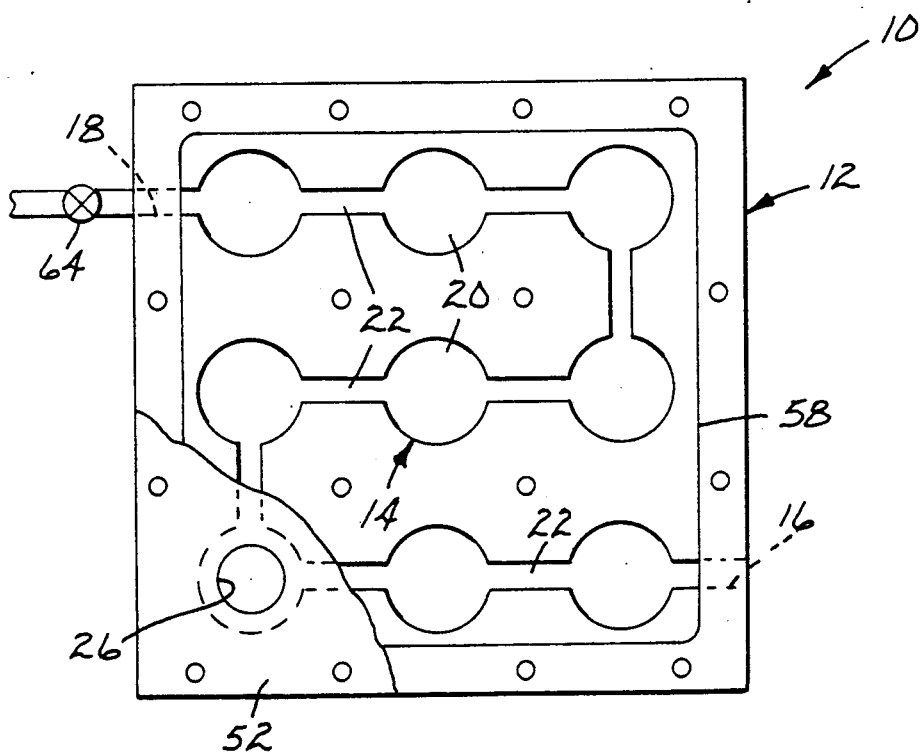
FIG. 2 is a plan view of a frame of the apparatus shown in FIG. 1 along with a portion of a flexible overlying sheet, showing a serpentine flow channel formed in the frame.

A flow-through heat transfer apparatus is broadly designated by the numeral 10 in FIGS. 1–5 and includes a rigid frame 12 that is formed with a channel 14 for the flow of heat transfer fluid therealong. As depicted in FIG. 2, the channel 14 has an inlet 16 and an outlet 18, and extends along the frame 12 in serpentine fashion from one side of the frame 12 to an opposite side. The channel 14 includes nine cylindrical chambers 20 that are interconnected by a series of elongated, rectangular passages 22. The frame 12 is made from a solid block of material, and the channel 14 is formed in one face of the block such that all of the chambers 20 and the passages 22 are open until remaining components of the apparatus 10 are assembled to the frame 12.

A sheet 24 made of flexible material such as a plastic film is connected to the frame 12 over the open top of the chambers 20 and the passages 22. The sheet 24 is approximately the same size in plan view (FIGS. 1-2) as the frame 12, so that when the sheet 24 is placed over the frame 12 the sheet extends over the entire channel 14 except in areas near the inlet 16 and the outlet 18 (both of which are made by drilling respective holes through interior regions of the block frame 12.

The sheet 24 has nine circular holes 26 (one of which is shown in FIG. 2) that are each centered over a respective one of the chambers 20. A thermal via 28 extends through each of the holes 26, and the nine vias 28 are likewise aligned with the central axes of the chambers 20.

Figure 3:
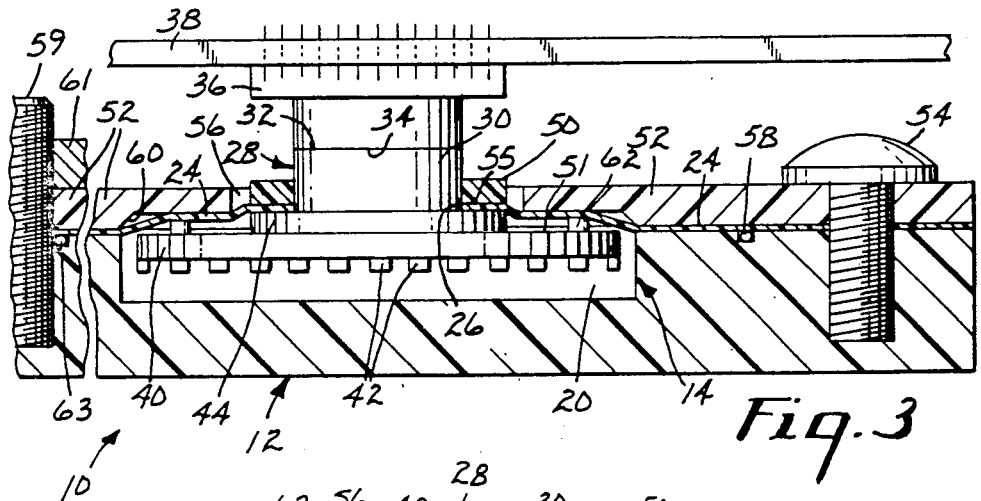
FIG. 3 is an enlarged, fragmentary, side cross-sectional view of the apparatus of FIG. 1, wherein a thermal via of the apparatus has moved outwardly for contact with an integrated circuit mounted on a circuit board.
Figure 4:
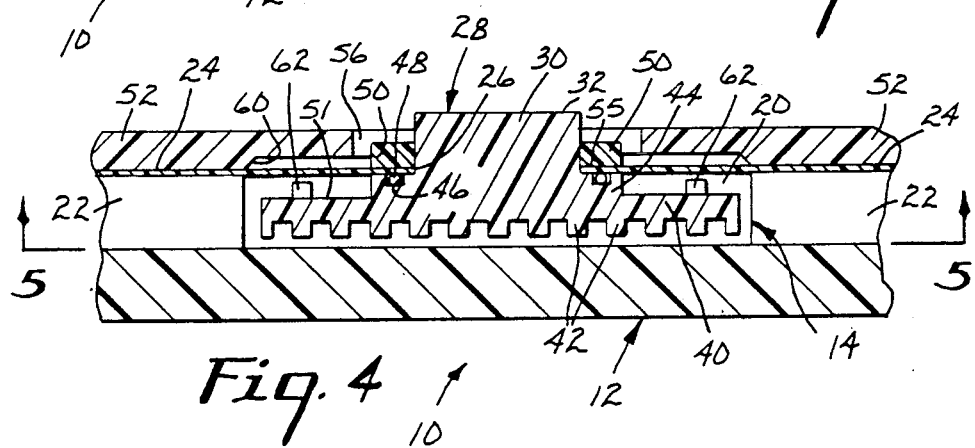
FIG. 4 is an enlarged, fragmentary, end view in partial section and somewhat similar to FIG. 4 but of the apparatus alone and with the via moved inwardly from the position shown in FIG. 3.
Figure 5:
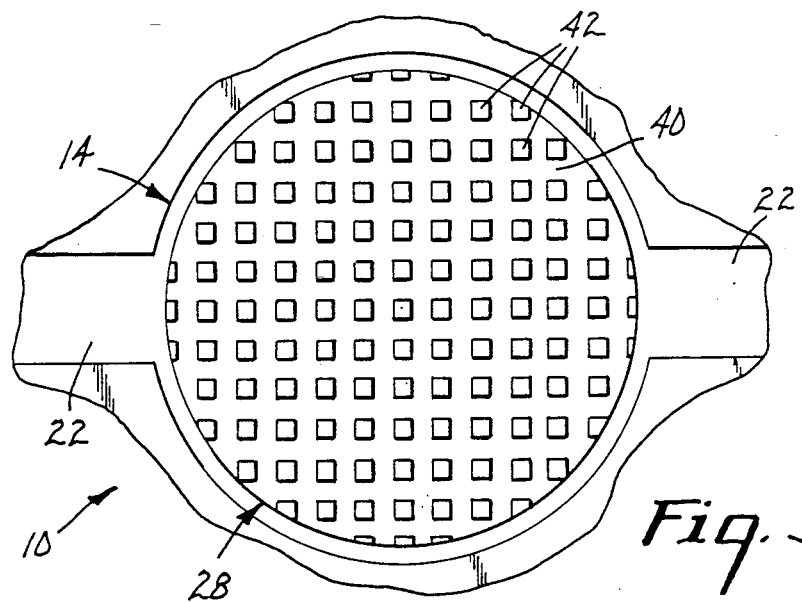
FIG. 5 is an enlarged, fragmentary, bottom view taken along lines 5—5 of FIG. 4.

Details of a representative via 28 are shown in FIGS. 3-5. The via 28 has a first cylindrical portion 30 that extends through the hole 26 in a direction outwardly from the sheet 24 and the channel 14, and has a planar top 32 for direct, abutting contact with a flat external surface 34 of a heat generating component 36 which, in this instance, is an integrated circuit chip that is mounted on a circuit board 38.

The via 28 further includes a second portion 40 remote from the first portion 30. The second portion 40 is located integrally connected to said first portion 30 and in the chamber 20 of the channel 14 for contact with heat transfer fluid flowing therein. The bottom of the second portion 40 has an array of small stubs or fins 42 that provide extensive surface area for intimate contact and thus efficient heat exchange with fluid flowing in the channel 14.

The via 28 has an intermediate portion 44 located between the first portion 30 and the second portion 40. The portion 44 is coaxial with the portions 30, 40 and is in the shape of a cylinder having a diameter larger than the diameter of the first portion 30 and smaller than the diameter of the second portion 40. A groove 46 is formed in the top of the intermediate portion 44 and receives an O-ring 48.

An annular lock ring 50, together with the O-ring 48, comprises a means for sealingly connecting the via 28 to the sheet 24 in an area adjacent the hole 26. The lock ring 50 has an inner diameter slightly smaller than the outer diameter of the first portion 30 in order to establish a self-sustaining, interference fit relationship when the lock ring 50 is pressed over the first portion 30. During such assembly, the lock ring 50 presses the sheet 24 against the O-ring 48 in order to connect the via 28 to the sheet 24 in essentially leak-free relation. Although not shown, the lock ring 50 is provided with threaded holes for coupling the lock ring 50 to a pressing tool for detaching the lock ring 50 from the via 28 if maintenance or repair of the apparatus 10 is desired.

The second portion 40 of the via 28 has a larger external surface area than the exposed external surface area of the first portion 30, such that the second portion 40 functions as a heat-radiating body to quickly dissipate thermal energy conducted from the surface 34 of the component 36 to the top 32 and thence through the via 28. The intermediate portion 44, being of smaller diameter than the second portion 40, serves as a stand-off in order to space the second portion away from the underside of the sheet 24 and thereby enable the heat transfer liquid to contact a top wall 51 of the second portion 40 as well as the extended surface presented by the fins 42.

A flat cover structure 52 is connected to the frame 12 by means of screws 54. The structure 52 has nine apertures 56, each aligned with a respective chamber 20 and via 28. As shown in FIGS. 2 and 3, an O-ring 58, received in a groove extending around the perimeter of the frame 12 inwardly of the screws 54, provides a seal for connecting the sheet 24 to the frame 12 in substantially leak-free relation when the structure 52 is connected by the screws 54 to the frame 12.

FIG. 3 depicts a stud 59 that is threaded into the frame 12 in inner regions of the latter to facilitate maintaining inner areas of the structure 52 in flat, firm contact with the sheet 24 and clamped against the frame 12. The stud 59 passes through a hole in the structure 52 and is threaded into a nut 61. An O-ring 63 prevents leakage of fluid adjacent the stud 59.

The structure 52 extends over the entire frame 12 and thus also extends across portions of the sheet 24 adjacent the vias 28. As shown in FIGS. 3 and 4, the structure 52 has a chamfered recess 60 approximately the same diameter as the chamber 20 adjacent the aperture 56, so that the flexible sheet 24 has space to flex outwardly away from the frame 12 when fluid pressure is present in the channel 14. The fluid pressure is exerted on both the via 28 and portions of the sheet 24 adjacent the recess 60 (see, e.g., portion 55 in FIGS. 3-4) such that the via 28 moves with the portions of the sheet 24 outwardly from the retracted position shown in FIG. 4 and to the extended or deflected position shown in FIG. 3 until the top 32 engages the surface 34 of the component 36.

The flexible sheet 24 enables each via 28 to move in independent fashion for contact with the surface 34 of the respective component 36. As such, the surfaces 34 need not be precisely located in the same plane. The structure 52, however, limits outward movement of the sheet 24 when heat transfer fluid is directed through the channel 14, since the portion 55 of the sheet 24 surrounding the via 28 is blocked from undue deflection by sections of the structure 52 above the recess 60.

The via 28 is made of a metallic material such as aluminum that has a relatively high thermal conductivity. On the other hand, little if any heat transfer occurs across the sheet 24, and thus thermal conductivity of the sheet is not a concern. The sheet 24 may be selected from any one of a number of resilient plastic films that provide adequate flame retardance, sufficient flexibility and toughness, and are impermeable to liquid and air. A currently preferred film is made of polyester. The sheet 4 has sufficient flexibility to permit outward movement of the via 28, but is sufficiently tough to prevent undue movement of the via 28 in directions perpendicular to such direction of outward movement; consequently, the via 28 remains in substantial registration with the component 36.

The second portion 40 of the via 28 carries four upstanding pins 62 that are spaced equally apart around the perimeter of the second portion 40. The pins 62 are somewhat less in height than the height of the intermediate portion 44, and thus are slightly spaced from the sheet 24 as shown in FIG. 4 when fluid pressure is not present in the channel 14. During typical operation, the pins 62 contact the sheet 24 when the via 28 is deflected outwardly. If, as shown in FIG. 3, the via 28 is deflected sufficiently to cause at least one of the pins 62 to contact the structure 52 adjacent the recess 60, the pins 62 hold the sheet 24 away from the second portion 40 to permit continuous passage of heat transfer fluid in the space between the sheet portion 55 and the wall 51 to enable efficient dissipation of thermal energy from the via 28 to the fluid. Moreover, the pins 62 help assure that the flat top 34 remains generally parallel with the electronic component surface 34 and does not unduly tilt.

The configuration of the chamber 20 is closely complemental to portions of the via 28 within the channel 14. As a result, the effective velocity of the fluid during flow through the chamber 20 is relatively high, enabling enhanced transfer of heat from the via 28 to the fluid in areas adjacent the second portion 40.

The contact force between the via 28 and the component 36 can be controlled by a back pressure valve 64 (shown schematically in FIG. 2) located downstream of the fluid outlet 18. A pump (not shown) upstream of the inlet 16 provides positive pressure conditions within the channel 14, and thereby enables the valve 64 to control back pressure when desired. Deactivation of the pump causes the via 28 to retract, and permits easy removal of the apparatus 10 when necessary for servicing the electrical equipment.

Once the heat transfer fluid passes through the inlet 16, along the channel 14 and exits through the outlet 18, the fluid is directed to an external heat sink which is typically remote from the electrical equipment containing the circuit board 38. Preferably, the heat transfer fluid is a fluorochemical liquid that is thermally conductive, chemically inert, essentially gas-free and thermally stable. The liquid is electrically non-conductive to prevent short-circuiting of electronic components should the fluid leak from the apparatus 10 for any reason. In addition, the inert character of the liquid 32 will likely prevent substantial damage to electronic devices or equipment housings should the fluid leak from the apparatus 10. Particularly preferred liquids and other properties of such liquids are set out in a copending U.S. patent application, Ser. No. 07/503,839, filed Apr. 3, 1990, the disclosure of which is hereby expressly incorporated by reference into the present disclosure.

I claim:

1. Heat transfer apparatus comprising:
   a frame having a channel for the flow of heat transfer fluid, said channel having an inlet and an outlet;
   a sheet of flexible material connected to said frame, a portion of said sheet extending along said channel, said portion of said sheet being movable and having a hole;
   a thermal via extending through said hole and having a first portion and a second portion, said via being connected to said sheet for movement therewith, said first portion extending outwardly from said sheet and said channel for thermal connection with a heat generating component, said second portion being located in said channel for contact with said heat transfer fluid and having a wall facing said sheet;
   structure connected to said frame and extending across at least said portion of said sheet adjacent said via for limiting outward movement of said sheet when heat transfer fluid is directed through said channel; and
   at least one pin connected to said second portion of said via and extending toward said sheet forming means for substantially preventing said portion of said sheet from contacting said wall during movement of said via.

2. The apparatus of claim 1, wherein said structure clamps said sheet to said frame.

3. The apparatus of claim 1, wherein said second portion of said via includes an array of spaced apart, heat dissipating fins.

4. The apparatus of claim 1, wherein said structure comprises a generally flat cover extending across said frame and having an aperture, and wherein said first portion of said via extends through said aperture for thermal connection with a heat generating component.

5. The apparatus of claim 1, wherein said channel includes a chamber and a passage communicating with said chamber, and wherein said second portion of said via is received in said chamber.

6. Heat transfer apparatus comprising:
   a frame having a channel for the flow of heat transfer fluid, said channel having an inlet and an outlet;
   a sheet of flexible material connected to said frame, a portion of said sheet extending along said channel, said portion of said sheet being movable and having a hole;
   a thermal via extending through said hole and having a first portion and a second portion, said via being connected to said sheet for movement therewith, said first portion extending outwardly from said sheet and said channel for thermal connection with a heat generating component, said second portion being integrally connected to said first portion and being located in said channel for contact with said heat transfer fluid;
   structure connected to said frame and extending across at least said portion of said sheet adjacent said via for limiting outward movement of said sheet when heat transfer fluid is directed through said channel; and
   a lock ring releasably connected to said via and surrounding said first portion of said via for sealingly connecting said via to said sheet.

\* \* \* \* \*